June 1, 1965 W. HERMES 3,187,265

AMPLIFIER WITH CIRCUITRY FOR PRODUCING A CONSTANT INPUT SIGNAL LEVEL INDICATION

Filed June 17, 1960

INVENTOR

Willem Hermes

BY

Frank R. Jifari

AGENT

United States Patent Office 3,187,265 Patented June 1, 1965

3,187,265
AMPLIFIER WITH CIRCUITRY FOR PRODUCING A CONSTANT INPUT SIGNAL LEVEL INDICATION

Willem Hermes, Hilversum, Netherlands, assignor to North American Philips Company, Inc., New York, N.Y., a corporation of Delaware Filed June 17, 1960, Ser. No. 36,931
Claims priority, application Netherlands, July 11, 1959, 241,196
4 Claims. (Cl. 330—2)

The invention relates to an amplifier circuit comprising an amplifier in which an output amplifying stage feeds a variable output load. A negative feed-back circuit is connected to the output circuit of the output amplifying stage. The amplifier circuit includes a monitoring device supervising the level of the input signal of the amplifier. The amplifier may comprise valves or transistors and the monitoring device may be an indicator, an alarm circuit or the like, which produces an alarm signal when given limit values of the input level are exceeded.

Such circuits may be used for various purposes, for example, in pilot receivers in carrier-frequency telephone systems, having a variable load in the form of level control-device, whilst at the same time the pilot level is to be supervised accurately.

The invention has for its object to provide a circuit of the kind set forth, in which, an accurate level supervision is maintained, and the circuit is materially simplified.

The circuit according to the invention is characterized in that for the supervision of the input level of the amplifier the output circuit of the output amplifying stage includes apart from the negative feed-back circuit a compensation resistor, the value of which is substantially equal to the internal resistance of the negative feed-back amplifier. The monitoring device is connected to a point lying between the output amplying stage and the compensation resistor.

When using the measures according to the invention, the amplifier already provided is used not only for feeding the variable load but also for the supervision of the input signal of the amplifier, and the indication of the monitoring device, in spite of strong variations of the output load, is not affected.

In a first embodiment, which may be used advantageously with negative voltage feed-back amplifiers, the compensation resistor consists of a series resistor connected in series with the output load of the output amplifying stage, while the monitoring device is connected in parallel with this series combination of the compensation resistor and the output load.

In a second embodiment, which may be used advantageously in a negative current feed-back amplifier, the compensation resistor consists of a parallel resistor connected in parallel with this output load, while the monitoring device is connected in series with this parallel combination of the compensation resistor and the output load.

The invention and its advantages will now be described more fully with reference to the figures.

Figure 1:
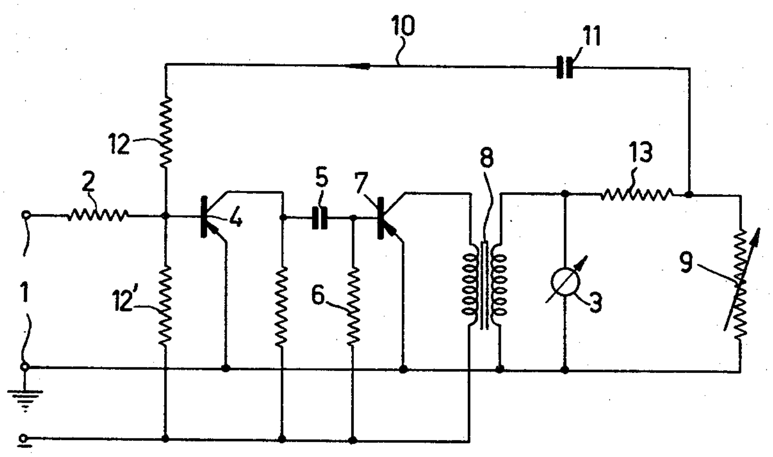
Figure 2:
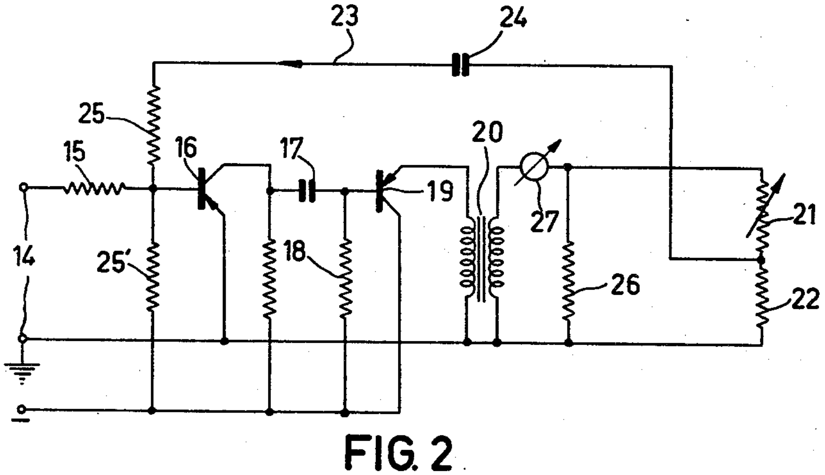

FIG. 1 shows a circuit according to the invention comprising a voltage feed-back amplifier and FIG. 2 shows a circuit according to the invention comprising a current feed-back amplifier.

FIG. 1 shows a circuit according to the invention comprising transistors in a two-stage amplifier. Incoming signals are fed via input terminals 1 and a series resistor 2 to the input circuit of the amplifier. A monitoring device 3, in the form of a voltage meter, is provided to supervise the level of the incoming signals.

The amplifier comprises a preamplifier 4 with a transistor in common emitter connection, the amplified output signals of amplifier 4 being fed via an RC-network to the base electrode of the output amplifying stage 7, in common emitter connection, which is coupled via a transformer 8 with a variable output load 9. The output load 9 may fluctuate for example between 1500 ohm and 3000 ohm. The amplifier comprises furthermore a negative voltage-feed-back circuit 10 between the output circuit and the input circuit, which circuit includes the series combination of a separation capacitor 11 and a series resistor 12, connected to the base of the transistor 4, which is connected via the resistor 12′ to the negative terminal of the voltage supply source. By suitable proportioning of the series resistor 12 in connection with the value of the resistor 2, the negative feed-back factor is adjusted to a desired value. In the amplifier shown the negative feed-back amounts, for example, to about 20 db.

In accordance with the invention the amplifier described is utilized to feed the monitoring device 3 without the indication of the monitoring device 3 being affected by the variable load 9, since the output circuit of the output amplifying stage 7 includes not only the negative feed-back circuit 11 but also a compensation resistor 13. The value of resistor 13 is equal to the internal resistance of the negative feed-back amplifier 4–7. The monitoring device 3 is connected to a point lying between the output amplifying stage 7 and the compensation resistor 13. In the embodiment shown the compensation resistor consists, more particularly, of a series resistor connected in series with the variable load 9 (13), which resistor has a value of, for example, 150 ohm. The monitoring device 3 is connected in parallel with this series combination of the compensation resistor 13 and the variable load 9.

The invention will now be explained more fully. In the equivalent diagram of the negative voltage feed-back amplifier 4–7, assuming that the compensation resistor is omitted, this amplifier may be represented by a voltage source having a voltage $V_i$ and an internal resistance $R_i$, which is reduced by the feed-back with a factor equal to the feed-back factor. The variable output load 9 of this voltage source is designated by $R_u$. The relationship between the voltage $V_i$ of the voltage source, which is proportional to the input voltage of the amplifier, and the current passing through the output load $R_u$ I is then defined by the equation:

$$V_i = IR_i + IR_u \quad (1)$$

The output voltage of the output amplifying stage $IR_u$ is determined by the value of the voltage $V_i$ and the value of the output load $R_u$, i.e. the output voltage $IR_u$ of the output amplifying stage 7 will vary with the load resistance 9.

Despite this strong dependence of the output voltage of the output amplifying stage 7 upon the output load 9, a voltage may nevertheless, in accordance with the invention, be derived from the output circuit of the output amplifying stage 7, which voltage is completely independent of the output load 9, so that it can be used for monitoring purposes. To this end the load resistor 9 has connected with it in series not only the negative feed-back circuit 10 but also the compensation resistor 13. The value of resistor 13 is substantially equal to the internal resistance of the negative feed-back amplifier 4–7 without compensation resistor 13, so that it is equal to $R_i$. The voltage which is independent of the output load 9 is obtained from the series combination of the compensation resistor 13 and the variable output load 9.

If the internal resistance of the voltage generator formed by the negative feed-back amplifier 4–7 and the compensation resistor 13 connected in series therewith and lying outside the feed-back circuit 10 is calculated, it appears that this internal resistance is substantially equal to the value of the internal resistance $R_i$ of the negative voltage feed-back amplifier 4–7 without compensation resistor 13, so that it is also true in this circuit that:

$$V_i = IR_i + IR_u$$

i.e. the relation (1). Since the compensation resistor 13 is equal to the internal resistance $R_i$ of the negative feed-back amplifier 4–7, the voltage across the series combination of the compensation resistor 13 and the output load 9 is $IR_i + IR_u$ (2) and in accordance with the relation (1) this voltage is equal to the voltage $V_i$. Therefore, the indication of the voltage meter 3 is determined only by the level of the input signals of the amplifier.

When using the measures according to the invention, the indication of the device 3 is independent of load variations to a very great extent. It appears, for example, that with load variations of a factor 2 still no measurable deviation (less than 0.1%) occurs in the indication of the voltage meter 3. Apart from the surprisingly simple and reliable supervision of the input level, the circuit of the invention has the further advantage that the compensation resistor absorbs only a small fraction of the power produced by the output amplifier 7, for example, 10%.

FIG. 2 shows a further embodiment of the circuit according to the invention, in which, as described with reference to FIG. 1, the incoming signals are fed via input terminals 14 and a series resistor 15 to the input circuit of a transistor preamplifier 16 in common emitter connection. The output circuit of the preamplifier 16 is connected via an RC-network 17, 18 to the base of an output amplifying stage 19 in common collector connection, which is connected via a transformer 20 to a variable load resistance 21. The two-stage amplifier is negative current feed-back, i.e. a negative feed-back resistor 22, traversed by the output current is connected in series with the output load 21. The negative feed-back resistor 22 is connected via a negative feed-back circuit 23 including the series combination of a separation capacitor 24 and a series resistor 25 to the emitter electrode of the transistor 16, which is connected via a resistor 25′ to the negative terminal of the voltage supply source. In the embodiment shown the negative feed-back amounts to about 20 db. As is known, the internal resistance $R_i$ of the negative current feed-back amplifier 16–19 has increased by a factor equal to the negative feed-back factor.

In order to supervise the level of the incoming signals, which is to be independent of variations of the output load 21, the circuit shown includes, in parallel with the output load 21, a compensation resistor 26, of which the value is substantially equal to the internal resistance $R_i$ of the negative current feed-back amplifier 16–19 without the compensation resistor. A monitoring device, such as current meter 27, is connected in series with this parallel combination 21–26. The indication of the current meter is determined in this case only by the level of the signals fed to the input terminals.

The device shown in FIG. 2 is the dual embodiment of the device shown in FIG. 1, which is described in detail in the foregoing paragraphs. In the same manner as described with reference to FIG. 1 it may be proved in the circuit of FIG. 2 that by connecting the compensation resistor 26 in parallel with the variable output impedance 21, if resistor 26 has a value equal to the internal resistance $R_i$ of the negative current feed-back amplifier 16–19, the current meter 27 indicates a current which is determined only by the level of the signals fed to the input terminals 14.

It should be noted here that the device shown in FIG. 1 is particularly advantageous for use in negative voltage feed-back amplifiers, whereas the device shown in FIG. 2 is used preferably in negative current feed-back amplifiers.

What is claimed is:

1. An amplifier having an input circuit and an output circuit, variable impedance load circuit means, a compensation resistor, means serially connecting said load circuit and compensation resistor to said output circuit, means connected between said load circuit means and input circuit providing a negative feedback voltage to said input circuit, and signal level indicating means connected in parallel with said series connected load circuit and resistor, said resistor having a value substantially equal to the effective internal resistance of said amplifier, whereby signal levels indicated by said indicating means are substantially independent of the value of said variable impedance load circuit.

2. The amplifier of claim 1, in which said means providing a negative feedback voltage comprises a capacitor connected between said input circuit and the junction of said compensation resistor and load circuit means.

3. An amplifier having an input circuit and an output circuit, variable impedance load circuit means connected to said output circuit, a compensation resistor connected in parallel with said load circuit means, signal level indicating means connected in series between said output circuit and said parallel connected compensation resistor and load circuit means, and means connected between said load circuit means and input circuit for providing a negative current feedback to said input circuit, said compensation resistor having a value substantially equal to the effective internal resistance of said amplifier, whereby signal levels indicated by said indicating means are substantially independent of the value of said variable impedance load circuit means.

4. The amplifier of claim 3, wherein said means providing a negative current feedback comprises a feedback resistor serially connected with said load circuit means, and a capacitor connected between said input circuit and the junction of said feedback resistor and load circuit means.

References Cited by the Examiner

UNITED STATES PATENTS

| | | | |
|---|---|---|---|
| 2,098,950 | 11/37 | Black | 330—2 |
| 2,367,110 | 1/45 | Foyers | 330—75 X |
| 2,587,697 | 3/52 | Conrad | 330—2 |
| 2,994,216 | 7/60 | Allenden | 324—123 |
| 3,069,545 | 12/62 | Lide et al. | 330—75 X |

ROY LAKE, *Primary Examiner.*

ELI J. SAX, NATHAN KAUFMAN, *Examiners.*